US011527716B2

(12) United States Patent
Sarkar et al.

(10) Patent No.: US 11,527,716 B2
(45) Date of Patent: Dec. 13, 2022

(54) MEMORY DEVICE WITH BORON NITRIDE LINER

(71) Applicant: INTEL CORPORATION, Santa Clara, CA (US)

(72) Inventors: Santanu Sarkar, Boise, ID (US); Farrell M. Good, Meridian, ID (US)

(73) Assignee: Intel Corporation, Santa Clara, CA (US)

( * ) Notice: Subject to any disclaimer, the term of this patent is extended or adjusted under 35 U.S.C. 154(b) by 766 days.

(21) Appl. No.: 16/295,681

(22) Filed: Mar. 7, 2019

(65) Prior Publication Data

US 2020/0287133 A1  Sep. 10, 2020

(51) Int. Cl.
*H01L 45/00* (2006.01)
*H01L 27/24* (2006.01)

(52) U.S. Cl.
CPC ...... *H01L 45/1286* (2013.01); *H01L 27/2463* (2013.01); *H01L 45/1675* (2013.01); *H01L 27/2409* (2013.01); *H01L 45/1233* (2013.01)

(58) Field of Classification Search
CPC ............. H01L 45/1286; H01L 27/2463; H01L 45/1675; H01L 27/2409; H01L 45/1233; H01L 45/141; H01L 45/128; H01L 45/06
See application file for complete search history.

(56) References Cited

U.S. PATENT DOCUMENTS

| 10,381,072 B2 * | 8/2019 | Hu ........................ H01L 45/145 |
| 2011/0049465 A1 * | 3/2011 | Nagashima ......... H01L 27/0207 438/653 |
| 2019/0036022 A1 | 1/2019 | Pirovano et al. |

OTHER PUBLICATIONS

Karpov, et. al., "Phase Change Memory with Chalcogenide Selector (PCMS): Characteristic Behaviors, Physical Models and Key Material Properties," Mater. Res. Soc. Symp. Proc. vol. 1250, 2010 Materials Research Society, 10 pages.

* cited by examiner

*Primary Examiner* — Allison Bernstein
(74) *Attorney, Agent, or Firm* — Compass IP Law PC

(57) ABSTRACT

A new liner structure for improving memory cell design is disclosed that incorporates a boron nitride dielectric layer. An example memory device includes an array of memory cells with each of at least some of the memory cells having a stack of layers, the stack comprising at least one phase change layer. A dielectric layer is provisioned over one or more sidewalls of at least the phase change layer. The dielectric layer comprises both nitrogen and boron. The dielectric layer may be part of a liner structure that includes multiple layers, such as an alternating layer stack of boron nitride and silicon nitride. The dielectric layer can be deposited at low temperature (e.g., less than about 300° C.) while maintaining a low hydrogen content and a relatively high thermal conductivity.

17 Claims, 12 Drawing Sheets

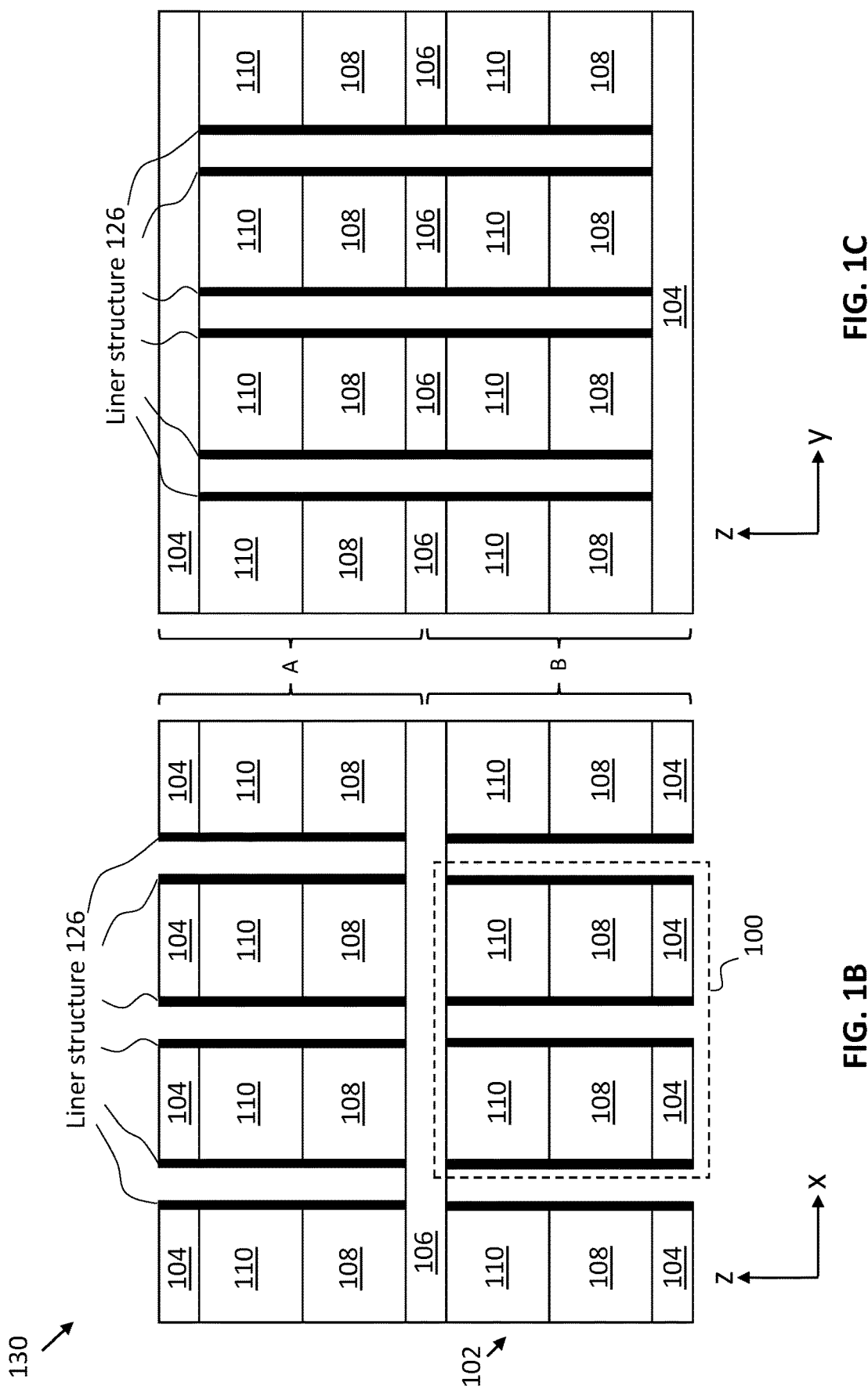

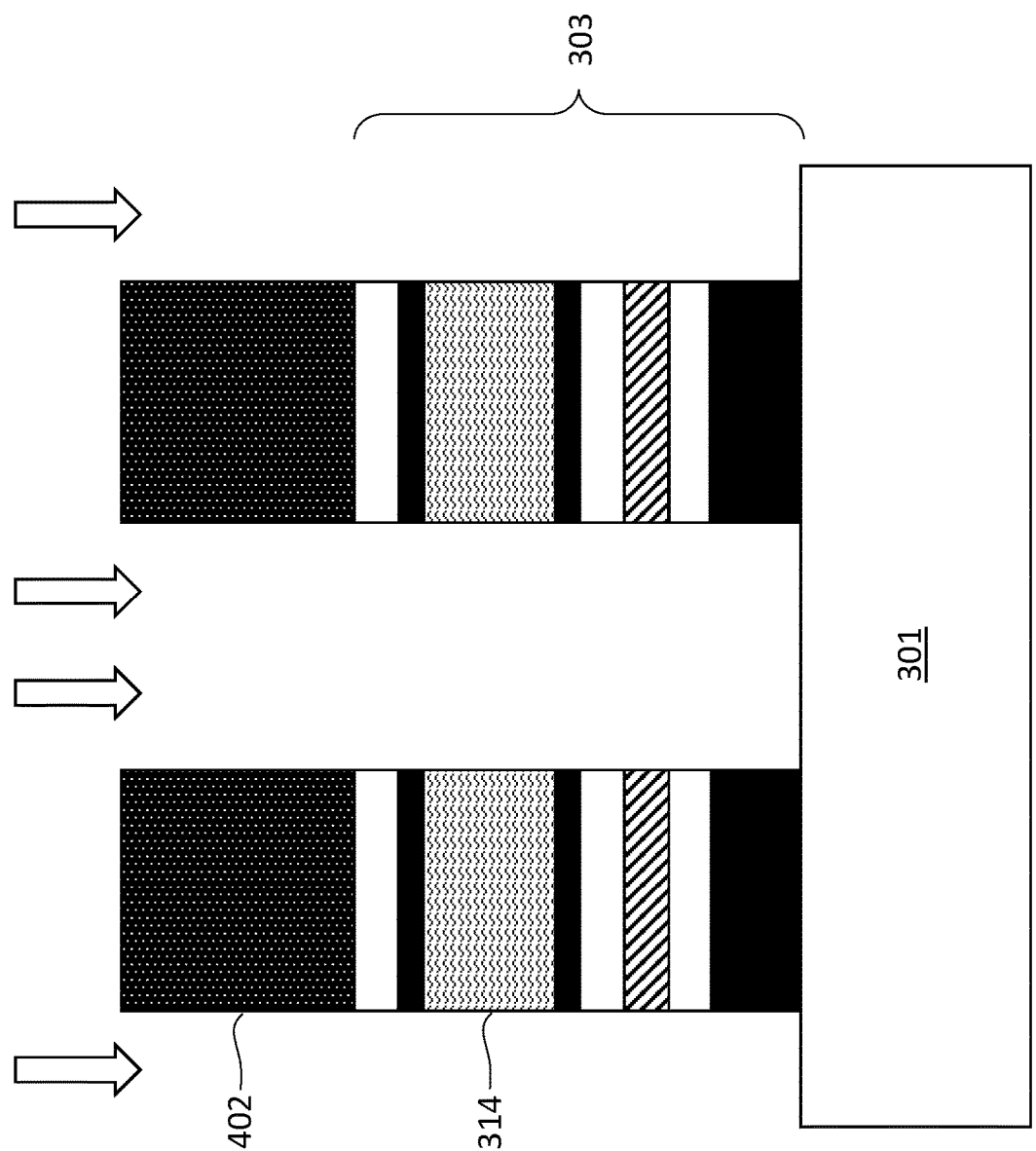

MEMORY DEVICE WITH BORON NITRIDE LINER

BACKGROUND

As electronic devices continue to become smaller and more complex, the need to store more data and access that data quickly similarly grows. New memory architectures have been developed that use an array of memory cells with so-called phase change materials (PCM) that have variable bulk resistance, allowing the resistance value to dictate whether a given memory cell stores a logic '0' or a logic '1'. Many challenges exist when fabricating such PCM-based memory architectures.

BRIEF DESCRIPTION OF THE DRAWINGS

Features and advantages of embodiments of the claimed subject matter will become apparent as the following Detailed Description proceeds, and upon reference to the Drawings, in which:

FIGS. 1B and 1C illustrate orthogonal cross-section views of a stacked array of memory cells, in accordance with some embodiments of the present disclosure.

FIG. 4 illustrates a cross-section view of another stage in a fabrication process for a portion of a memory device, in accordance with some embodiments of the present disclosure.

Figure 1A:
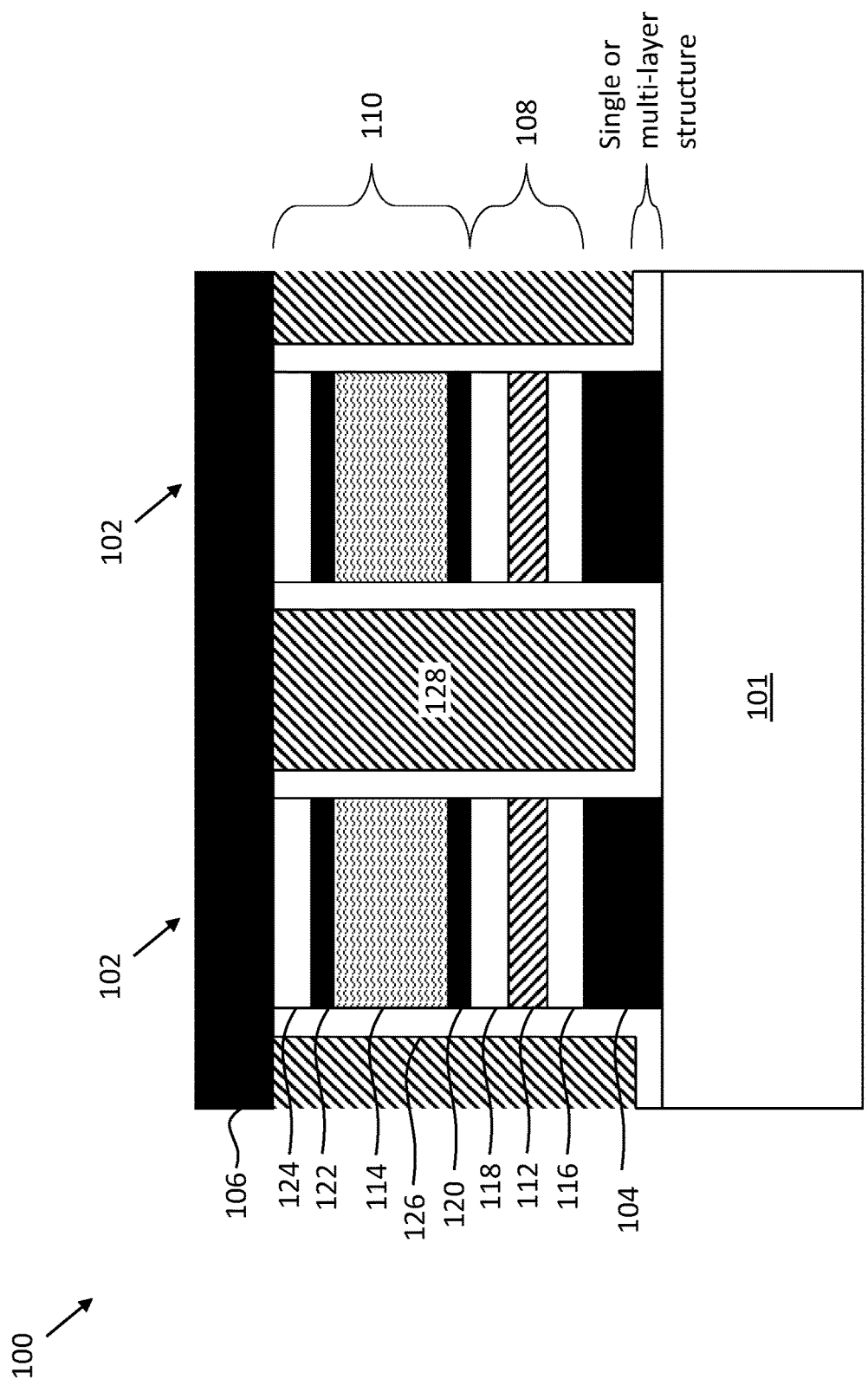
FIG. 1A illustrates a cross-section view of a portion of a stacked array of memory cells, in accordance with some embodiments of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

A memory cell design is disclosed. The design is particularly well-suited for three-dimensional cross-point (3D X-point) memory configurations, although other memory applications that can benefit as will be apparent. In an embodiment, the memory cell structure includes phase change and selector layers stacked between top and bottom electrodes. The phase change layer provides a storage element, and the selector layer provides a selector element that allows access to the storage element. An ohmic contact may be included between the phase change and selector layers. In any case, a liner layer or structure containing boron nitride is provided on sidewalls of the memory cells. In some examples, the liner layer includes only a single layer of boron nitride. In other examples, the liner layer includes a first layer of silicon nitride followed by a second layer of boron nitride. In still other examples, the liner layer includes an alternating stack of boron nitride and silicon nitride layers. As will be appreciated in light of this disclosure, the liner layer effectively protects the phase change layer from oxidation and exhibits a high thermal conductivity resulting in improved operation of the memory cell. Numerous configurations and embodiments will be apparent.

General Overview

As noted above, there are several non-trivial issues associated with fabricating memory arrays based on bulk resistance changes of a phase-change material. For example, in some cases, the phase change material is included as a layer in a multi-layer stack that further includes a selector layer as well as electrode material layers. This multi-layer stack is then etched into an array of smaller individual stacks. Each individual stack can be used as one memory cell in the overall array. The phase change material may be protected from further fabrication processes and from contaminants by depositing a thin dielectric layer over any of its exposed sidewalls. However, the phase change material is preferably not subjected to high temperatures (e.g., above around 300° C.), and thus the dielectric layer is deposited using a low-temperature process. The low temperature deposition can cause the dielectric layer to include a high hydrogen content, making the layer more prone to oxidation and exhibit poor hermiticity. Additionally, traditional dielectric layers deposited at low temperature exhibit a relatively low thermal conductivity, resulting in poor heat dissipation during operation of the memory cell.

To this end, techniques and memory cell designs are provided herein to help eliminate or otherwise reduce such issues. In an example embodiment, a fabrication methodology is provided that uses a new liner layer, or layered structure, for protecting the phase-change material of a memory cell, wherein that liner layer or structure includes a layer of boron nitride. An example memory device includes an array of memory cells with each of the memory cells having a stack of layers comprising at least one phase change layer and a dielectric layer over one or more sidewalls of at least the phase change layer. The dielectric layer comprises both nitrogen and boron, or boron nitride. The dielectric layer can be deposited at a relatively low temperature (e.g., less than about 300° C.) while maintaining a low hydrogen content and a relatively high thermal conductivity. Accordingly, the dielectric layer provides good barrier protection (e.g., as a gettering layer) to the phase-change material while also exhibiting good heat dissipation during the operation of the memory cell.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. For convenience, the phrase "FIG. 1" may be used to refer to the collection of drawings of FIGS. 1A-1B, and the phrase "FIG. 3" may be used to refer to the collection of drawings of FIGS. 3A-E.

It should be readily understood that the meaning of "above" and "over" in the present disclosure should be interpreted in the broadest manner such that "above" and "over" not only mean "directly on" something but also include the meaning of over something with an intermediate feature or a layer therebetween. Additionally, the meaning of "on" in the present disclosure should be interpreted to mean directly on something (i.e., having no intermediate feature or layer therebetween.)

Further, spatially relative terms, such as "beneath," "below," "lower," "above," "upper," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer. A substrate can be a layer, can include one or more layers therein, and/or can have one or more layer thereupon, thereabove, and/or therebelow.

Memory Array Architecture

FIG. 1A illustrates a cross-section view of a portion 100 of a memory cell array, according to an embodiment. Portion 100 includes adjacent memory cells 102 each including a stack of material layers sandwiched between a particular word line 104 and bit line 106, according to some embodiments. A potential is applied across a particular word line 104 and a particular bit line 106 in order to read from or program the memory cell 102 at the intersection of (between) the chosen word line 104 and chosen bit line 106. In this manner, word lines 104 and bit lines 106 provide top and bottom electrodes to memory cells 102. As noted in this example, word lines 104 run orthogonal to bit lines 106. Word lines 104 and bit lines 106 may be made of any conductive material, such as a metal, metal alloy, or polysilicon. In some examples, word lines 104 and bit lines 106 are made of tungsten, silver, aluminum, gold, carbon, or copper, or a multi-layer structure comprising such materials (e.g., tungsten and carbon layers).

Each memory cell 102 includes a first stack of layers 108 having at least one selector layer 112 and a second stack of layers 110 having at least one phase change layer 114, according to an embodiment. Selector layer 112 includes a material that acts similarly to a diode and is highly resistive until a threshold potential is applied across it, at which point its resistance lowers and current passes through it, according to some embodiments. Examples of materials for selector layer 112 include chalcogenide-based alloys, such as germanium telluride or germanium antimony telluride doped with arsenic. Any number of chalcogenides can be used to provide a standard selector layer 112.

As used herein, the term "selector layer" refers to the standard meaning of that phrase in the context of memory devices, and in some cases refers to one or more layers that includes a material capable of acting as a selector. For example, at least one selector layer 112 may include a chalcogenide alloy, such as chalcogenide doped with arsenic. As will be appreciated, such chalcogenide-based materials can be used as a selector for the memory cells of the array. The selector effectively provides access to the bit (logic '0' or '1') stored by the phase change layer 114.

Phase change layer 114 includes a material that changes its phase to either represent a logic '0' or a logic '1' for the given memory cell 102. As used herein, the term "phase change layer" refers to the standard meaning of that phrase in the context of memory devices, and in some cases refers to one or more layers that includes a metalloid alloy. The metalloids include boron (B), silicon (Si), germanium (Ge), arsenic (As), antimony (Sb), tellurium (Te), and polonium (Po). In some embodiments, phase change layer 114 includes chalcogenide, which comprises an alloy of germanium, arsenic, antimony, and tellurium, such as GeTe, GeSbTe, GeBiTe (GeTe alloyed with bismuth), or GeInSbTe (GeSbTe alloyed with indium), to name a few non-limiting examples. Moreover, note the stoichiometry of such compounds may vary from one embodiment to the next, and such compounds represented without stoichiometric coefficients or values are intended to represent all forms of that compound.

In one example, chalcogenide is used as the phase change material and can change between an amorphous state and a crystalline state based on applied temperature. In its amorphous state, the chalcogenide molecules are disorganized, and the material becomes highly resistive. In its crystalline state, the chalcogenide molecules are ordered, and the material becomes less resistive. For the purpose of the memory bit, the amorphous state of the chalcogenide may be read as a logic '0' and the crystalline state of the chalcogenide may be read as a logic '1'.

Either or both of first layer stack 108 and second layer stack 110 can include one or more other conductive layers. For example, first layer stack 108 can include a first conductive layer 116 and a second conductive layer 118 to provide enhanced ohmic contact to selector layer 112. In an embodiment, conductive layers 116 and 118 comprise carbon.

Second layer stack 110 may include conductive layers 120 and 122 which may provide electrode contacts to a phase change layer 114. Another conductive layer 124 may be provided as part of second layer stack 110. In some embodiments, conductive layer 124 comprises carbon.

As noted above, sidewalls of each memory cell 102 are protected by liner structure 126. Although liner structure 126 is illustrated as being a single continuous film, liner structure 126 may be deposited over the course of a plurality of deposition cycles. According to some embodiments, liner structure 126 represents a single material layer, or a plurality of material layers, that includes at least one boron nitride layer. Other dielectric materials, such as silicon nitride, may also be deposited as part of liner structure 126. The inclusion of liner structure 126 that includes boron nitride provides a material that can be deposited at a relatively low temperature (e.g., less than 300° C.) with a low hydrogen content, making the material a good sealant or barrier film to protect the underlying phase change layer 114 (and selector layer 112, if so desired) from oxidation. Furthermore, boron nitride exhibits a relatively high thermal conductivity compared to other more commonly-used dielectric materials, which provides better heat dissipation during operation of memory cell 102.

An example fabrication process flow to fabricate portion 100 of a memory array structure is shown with respect to FIGS. 3-7.

FIGS. 1B and 1C illustrate cross-section views of a memory array 130, according to some embodiments. Portion 100 of memory array 130 includes two memory cells 102 of the plurality of arrayed memory cells. The cross-section views are taken orthogonally to one another in memory array 130. Memory array 130 includes a plurality of memory cells 102 arranged in arrays A and B stacked in the Z-direction to form a 3D memory structure. The array includes an ordered arrangement of rows and columns of memory cells 102 in the XY plane as illustrated in FIGS. 1B and 1C. Other ordered arrangements are possible as well. Each memory cell 102 generally includes a first stack of layers 108 with one or more selector layers and a second stack of layers 110 with one or more phase change layers. According to some embodiments, sidewalls of each memory cell 102 are protected by a liner structure 126.

As can be further seen, memory array 130 includes a plurality of word lines 104 and bit lines 106 used to address a particular memory cell 102 with the stack. As noted in this example, word lines 104 run orthogonal to bit lines 106 and memory array 130 alternates between word lines 104 and bit lines 106 in the Z-direction. With reference to FIGS. 1B and 1C, word lines 104 run along the Y-direction (into and out of the page in FIG. 1B), and bit lines 106 run along the X-direction (into and out of the page in FIG. 1C).

It will be appreciated that the number of memory cells 102 illustrated is purely used as an example, and that any number of memory cells 102 can be used in each tier, and that any number of tiers in the Z-direction can be used as well. According to some embodiments, the height in the Z-direction of a given memory cell 102 is between about 100 nm and about 150 nm. According to some embodiments, the width in either the X-direction or the Y-direction of a given memory cell 102 is between about 10 nm and about 20 nm. The width may be the same in both the X-direction and the Y-direction. Any number of memory cell geometries can be utilized, as will be appreciated.

Figure 2:
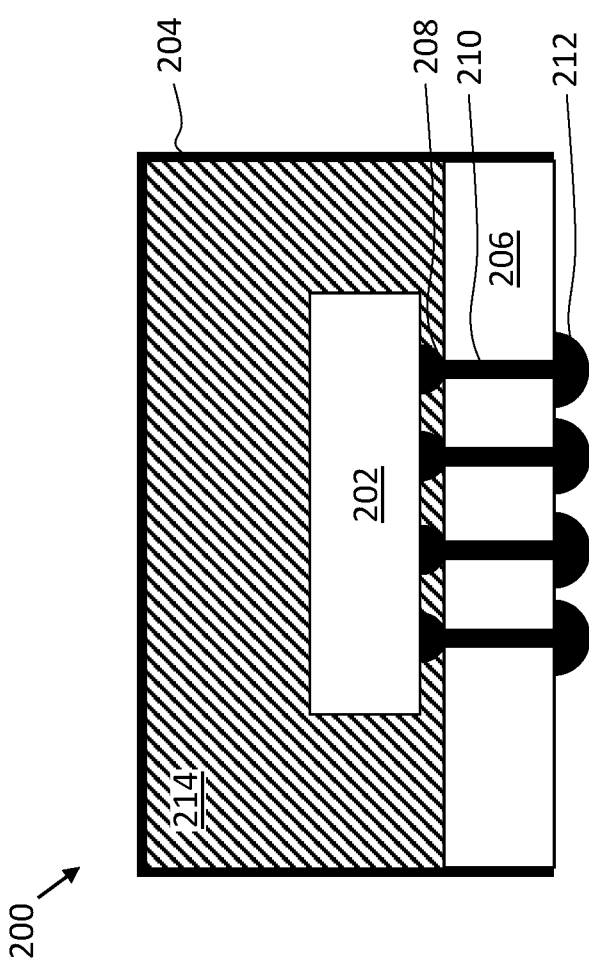
FIG. 2 illustrates a cross-section view of a chip package containing one or more memory dies, in accordance with some embodiments of the present disclosure.

FIG. 2 illustrates an example embodiment of a chip package 200. As can be seen, chip package 200 includes one or more dies 202. Chip package 200 may be a memory device when one or more dies 202 include one or more memory dies, whether it be a dedicated memory die, or some other die that has a memory portion juxtaposed to other functional circuitry of the die (e.g., such as a processor that has on-board memory). Die 202 may include any number of memory arrays 130 as well as any other circuitry used to interface with the memory arrays, in some example configurations. In still other embodiments, memory arrays 130 may be present on one die 202 and other circuitry used to interface (e.g., cell selection circuitry, readout circuitry, and programming circuitry) with die 202 is on another die within chip package 200.

As can be further seen, chip package 200 includes a housing 204 that is bonded to a package substrate 206. The housing 204 may be any standard or proprietary housing, and provides, for example, electromagnetic shielding and environmental protection for the components of chip package 200. The one or more dies 202 may be conductively coupled to a package substrate 206 using connections 208, which may be implemented with any number of standard or proprietary connection mechanisms, such as solder bumps, ball grid array (BGA), pins, or wire bonds, to name a few examples. Package substrate 206 may be any standard or proprietary package substrate, but in some cases includes a dielectric material having conductive pathways (e.g., including conductive vias and lines) extending through the dielectric material between the faces of package substrate 206, or between different locations on each face. In some embodiments, package substrate 206 may have a thickness less than 1 millimeter (e.g., between 0.1 millimeters and 0.5 millimeters), although any number of package geometries can be used. Additional conductive contacts 212 may be disposed at an opposite face of package substrate 206 for conductively contacting, for instance, a printed circuit board. One or more vias 210 extend through a thickness of package substrate 206 to provide conductive pathways between one or more of connections 208 to one or more of contacts 212. Vias 210 are illustrated as single straight columns through package substrate 206 for ease of illustration, although other configurations can be used (e.g., damascene, dual damascene, through-silicon via). In still other embodiments, vias 210 are fabricated by multiple smaller stacked vias, or are staggered at different locations across package substrate 206. In the illustrated embodiment, contacts 212 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 212, to inhibit shorting.

In some embodiments, a mold material 214 may be disposed around the one or more dies 202 included within housing 204 (e.g., between dies 202 and package substrate 206 as an underfill material, as well as between dies 202 and housing 204 as an overfill material). Although the dimensions and qualities of the mold material 214 can vary from one embodiment to the next, in some embodiments, a thickness of mold material 214 is less than 1 millimeter. Example materials that may be used for mold material 214 include epoxy mold materials, as suitable. In some cases, the mold material 214 is thermally conductive, in addition to be electrically insulating.

Fabrication Procedure

FIGS. 3-7 illustrate cross-section views of different stages of a fabrication process for portion 100 of memory array 130, according to some embodiments of the present disclosure. The various layers and structures illustrated in FIGS. 3-7 are not intended to be drawn to scale but are illustrated in a particular fashion for clarity. Some intermediate processes may be performed that are not explicitly illustrated, as will be appreciated (e.g., such as polishing and cleaning processes, or other standard processing). In other embodiments, not all illustrated layers are used and/or additional layers may be included. For instance, rather than having two conductive layers (e.g., 316 and 318), some embodiments may only have one conductive layer (e.g., 316 or 318). Likewise, the ohmic contact structure between selector layer 312 and phase change layer 314 may be omitted in some embodiments or integrated into one or both of selector and phase change material structures.

Figure 3:
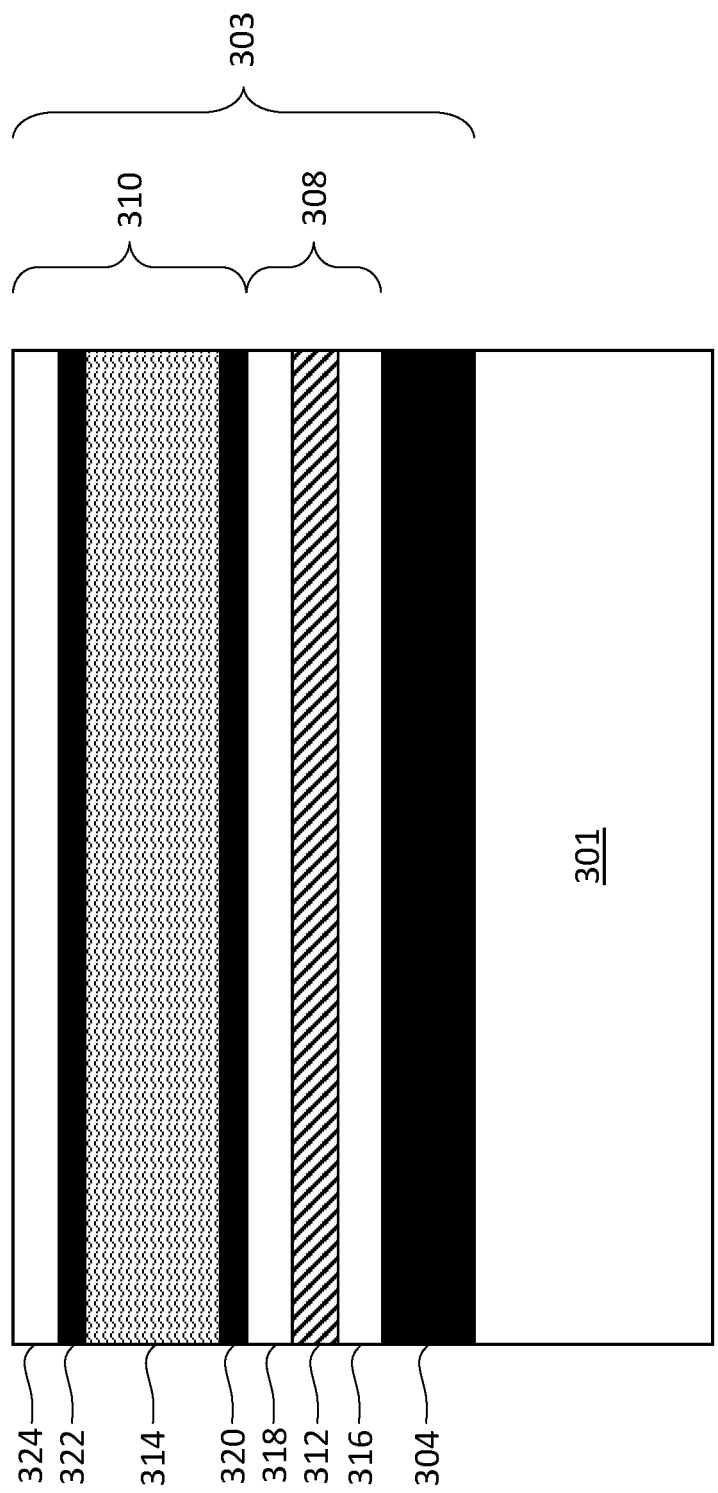
FIG. 3 illustrates a cross-section view of a stage in a fabrication process for a portion of a memory device, in accordance with some embodiments of the present disclosure.

FIG. 3 illustrates a stack of material layers deposited over a substrate 301, according to some embodiments. Substrate 301 may be any suitable substrate material for forming additional material layers over it. In some embodiments, substrate 301 includes a semiconductor material such as silicon, germanium, silicon germanium, gallium arsenide, or indium phosphide. Substrate 301 may include one or more insulating layers at its top surface, such as silicon oxide or silicon nitride, or buried below a top semiconductor layer such as in semiconductor-on-insulator substrate configurations.

A first conductive layer 304 may be deposited over the top surface of substrate 301. First conductive layer 304 may be a metal, such as tungsten, silver, aluminum, titanium, cobalt, or an alloy. In some embodiments, first conductive layer 304 has a sufficient thickness (e.g., 1 to 50 nm thick) to propagate signals after first conductive layer 304 has been patterned into word lines or bit lines.

A first stack of layers 308 may be deposited over first conductive layer 304. For example, a second conductive layer 316 may be deposited, followed by at least one selector layer 312, and a third conductive layer 318. Each of conductive layers 316 and 318 may include any conductive material that enhances the ohmic contact being made to at least one selector layer 312. In one example, conductive layers 316 and 318 comprise carbon. Other embodiments may not include conductive layers 316 and 318.

A second stack of layers 310 may be deposited over first stack of layers 308 and includes at least one phase change layer 314. A fourth conductive layer 320 may also be deposited over third conductive layer 318 to provide an electrode contact to phase change layer 314. Fourth conductive layer 320 may be a metal, such as tungsten.

According to some embodiments, one or more additional conductive layers are deposited over phase change layer 314 that provide a second electrode contact to phase change layer 314. For example, a fifth conductive layer 322 may be deposited followed by a sixth conductive layer 324. Fifth conductive layer 322 may be a metal, such as tungsten. Sixth conductive layer 324 may comprise carbon. In some embodiments, each of conductive layers 304, 320, and 322 comprise the same material and each of conductive layers 316, 318, and 324 comprise the same material.

The deposition of the various material layers over substrate 302 may be considered as the deposition of a stack of layers 303. Accordingly, in some embodiments, stack of layers 303 includes at least one selector layer 312 and at least one phase change layer 314. In some other embodiments, stack of layers 303 includes at least one phase change layer 314 and does not include selector layer 312. As noted above, other material layers may be deposited during, before, or after the deposition of any of the material layers discussed above depending on the application. The various layers may be deposited using standard deposition techniques, such as chemical vapor deposition (CVD), physical vapor deposition (PVD), and atomic layer deposition (ALD) techniques.

FIG. 4 illustrates an etching process being performed that etches through a thickness of at least a portion of stack of layers 303 to expose side walls of at least phase change layer 314, according to an embodiment. A mask layer 402 may be deposited and patterned using standard lithography techniques to expose particular regions to the etching process, as variously shown in FIG. 4. Mask layer 402 may be a dielectric material, such as silicon oxide or silicon nitride. In some embodiments, the etch is carried out by a directional (anisotropic) dry etch, although wet etching can be used as well (albeit less directional) or a combination of wet and dry etching, in still other embodiments. Note that the etching process can cause, for instance, rounding of the top corners of mask layer 402 and/or rounding at the trench bottom, given real-world process limitations, as will be appreciated. The arrows indicate the general direction of a standard anisotropic dry etching process, according to one embodiment.

The arrows indicate the general direction of the dry etching process. According to an embodiment, the anisotropic etch is performed using conventional dry etching techniques by placing substrate 301 into a vacuum chamber and introducing various gas chemistries and bias potentials to etch through the various material layers. In some embodiments, the etch process includes more than one etching procedure. For example, a first etch may be performed through a portion of the total thickness of stack of layers 303, followed by depositing one or more additional films, then performing a second etch through a remainder of the thickness of stack of layers 303. The additional films deposited during the etching process are not shown for clarity but may be provided to protect phase change layer 314 during subsequent etching processes.

Figure 5A:
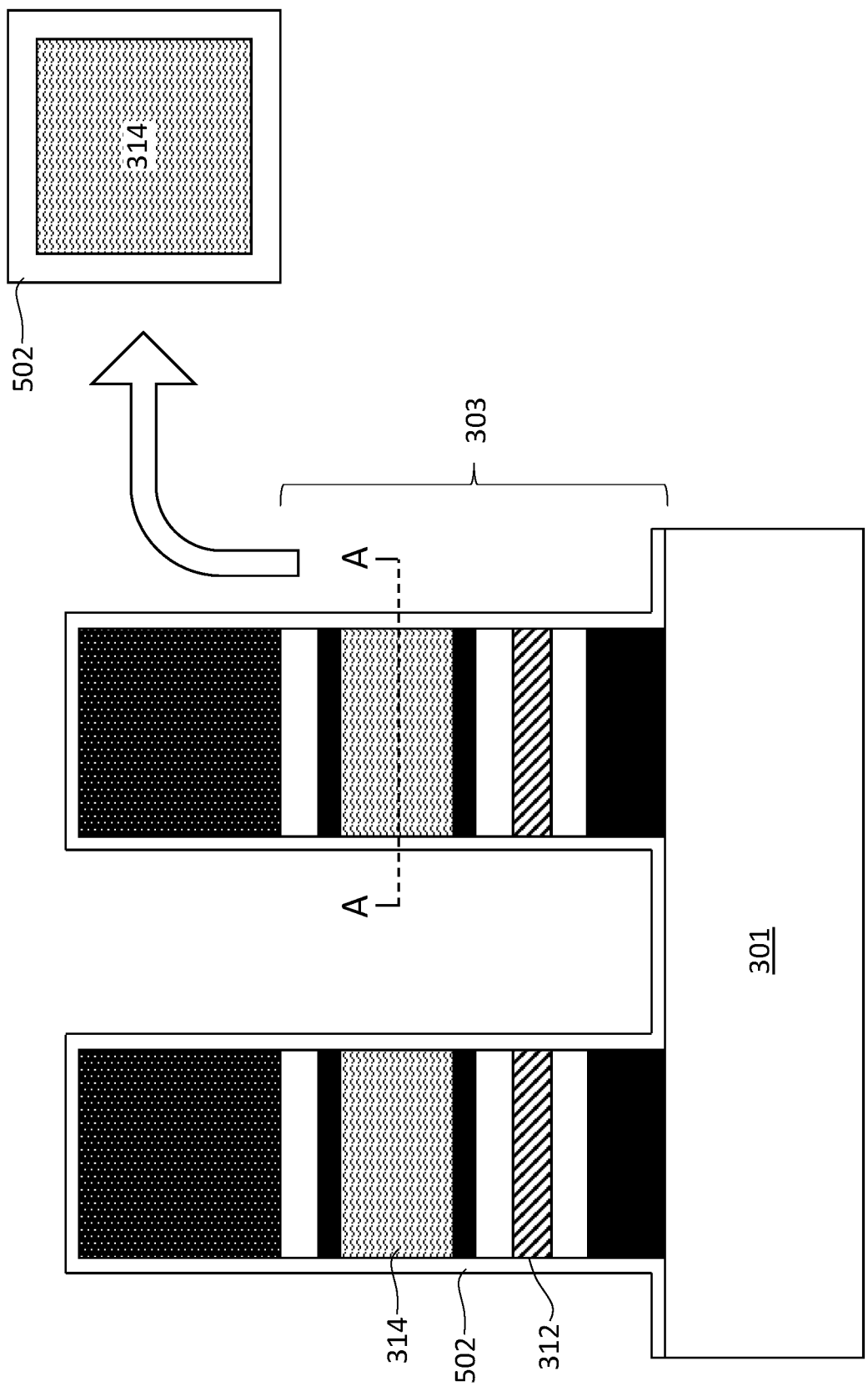
FIGS. 5A-5C illustrate cross-section views of different examples of another stage in a fabrication process for a portion of a memory device, in accordance with some embodiments of the present disclosure.
Figure 5B:
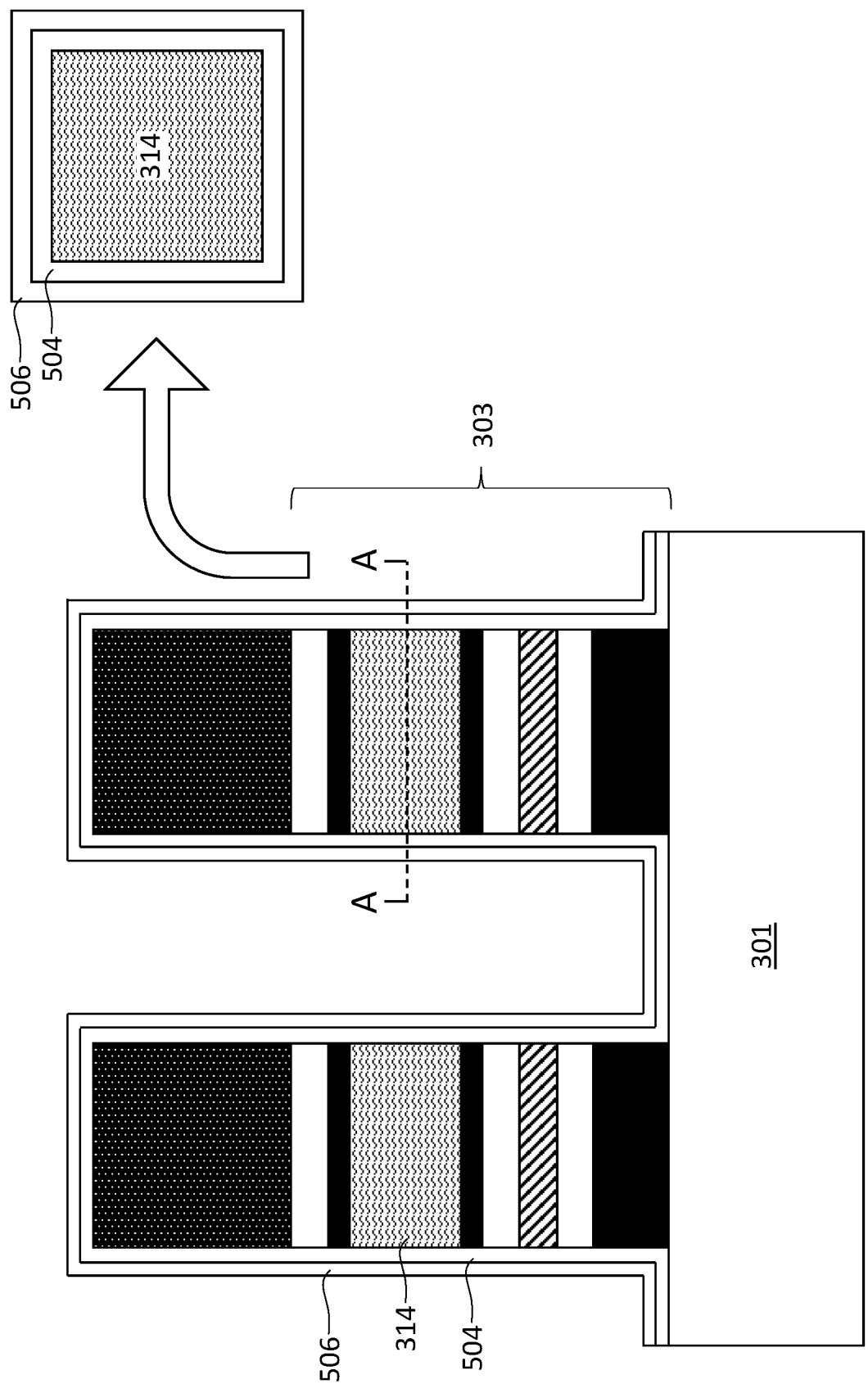
Figure 5C:
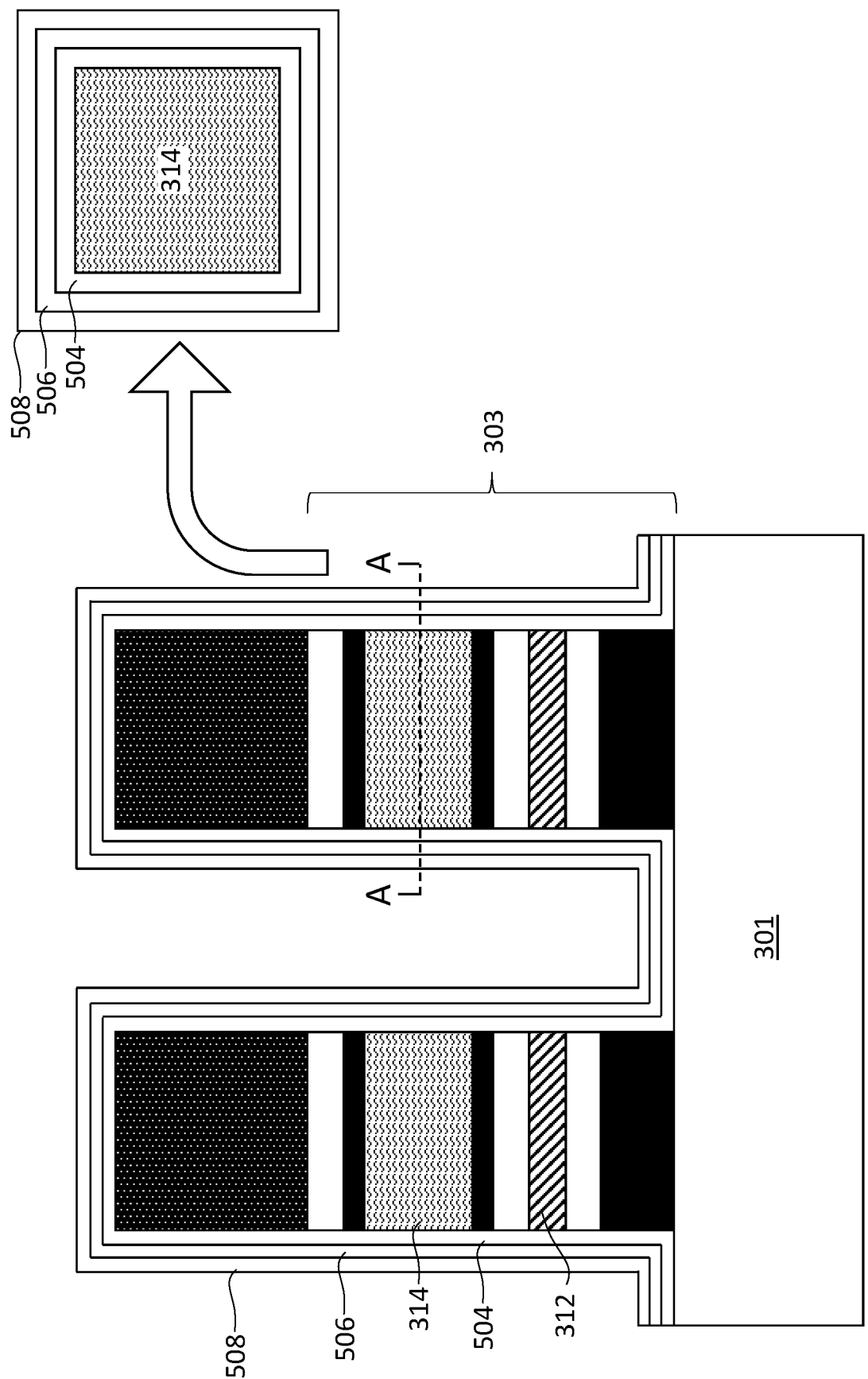

FIGS. 5A-5C illustrate different examples of liner structures that can be deposited to protect at least phase change layer 314, according to some embodiments. FIG. 5A illustrates a first example embodiment where a dielectric layer 502 comprising boron and nitrogen is deposited on one or more sidewalls of at least phase change layer 314. Dielectric layer 502 also blankets exposed portions of substrate 301 and/or sidewalls of any of the other layers in stack of layers 303, according to some embodiments.

A top-down view is also illustrated taken across the dashed cross-section line A-A. The top-down view shows how dielectric layer 502 may be deposited on all exposed sidewalls (e.g., all four sidewalls) of phase change layer 314.

Dielectric layer 502 may be deposited, for example, using a low-temperature plasma enhanced chemical vapor deposition (PECVD) process or a low-temperature plasma enhanced atomic layer deposition (PEALD). The blanket thickness (i.e., thickness measured on a horizontal planar surface, such as the top surface of substrate 301) of dielectric layer 502 may be between about 30 Å and 250 Å, according to some embodiments. The thickness of dielectric layer 502 on the sidewalls of phase change layer 314 may be less than the blanket thickness, depending on the conformality of the deposition technique employed. The deposition temperature of dielectric layer 502 may be, for example, between about 250° C. and 280° C., according to some embodiments. In other embodiments, the deposition temperature is less than 100° C. In some such example cases, dielectric layer 502 is deposited by flowing between 1000-4300 sccm of nitrogen gas, or between 100-1000 sccm of ammonia gas, along with between 50-1000 sccm of $B_2H_6$ as the boron precursor in a standard plasma deposition chamber at around 670 W of applied power. The boron source can be selected from a wide variety of boron precursors, for example, but not limited to, hydrides of boron [e.g. diborane ($B_2H_6$)], halides of boron ($B_2X_6$, where X=F, Cl, Br, I), alcohols or esters of boron [e.g. $B(OR)_3$ where R=H, methyl, ethyl, isopropyl and any other alkyl or aromatic chains] or diborane-ammonia ($BH_3.NH_3$) coordination complex. The nitrogen source can be selected from a wide variety of nitrogen precursors, for example, but not limited to, nitrogen gas ($N_2$), ammonia ($NH_3$), hydrazine ($N_2H_4$) or any other nitrogenous compounds. In one example, the boron to nitrogen ratio of deposited dielectric layer 502 is around 1:1.

According to an embodiment, dielectric layer 502 exhibits a high thermal conductivity relative to other non-boron containing dielectric layers. Table 1 below provides estimated thermal conductivity values for boron nitride films compared to other commonly used dielectric films.

TABLE 1

| Dielectric Material | Estimated K (W/mK) |
| --- | --- |
| PEALD Silicon Oxide | 0.90 |
| CVD Silicon Oxide | 1.17 |
| ALD Silicon Nitride | 1.10 |
| PECVD Silicon Nitride | 1.29 |
| Hexagonal Boron Nitride | 600 |
| Cubic Boron Nitride | 740 |

As observed in Table 1, both hexagonal and cubic boron nitride films exhibit a far greater thermal conductivity compared to silicon nitride or silicon oxide. In some embodiments, due to the low temperature deposition process for dielectric layer 502, its thermal conductivity may fall somewhere between about 30 and 600 W/mK. In some embodiments, dielectric layer 502 may have a crystallographic structure that is primarily hexagonal with a relatively small portion that is cubic. In some other examples, dielectric layer 502 has an amorphous crystallographic structure. In still other examples, dielectric layer 502 has a crystallographic structure that is at least one of amorphous, hexagonal, cubic, or wurtzite.

As will be appreciated in light of this disclosure, dielectric layer 502 provides good protection to phase change layer 314 from contaminants and from oxidation. According to some embodiments, dielectric layer 502 includes less than about 10%, less than about 5%, less than about 1%, less than about 0.5%, or about 0.1% or less by weight of hydrogen, or otherwise close to 0.0%.

FIG. 5B illustrates another example embodiment where a first dielectric layer 504 comprising silicon and nitrogen (e.g., silicon nitride) is deposited on one or more sidewalls of at least phase change layer 314, followed by a second dielectric layer 506 comprising boron and nitrogen (e.g., boron nitride). In some such embodiments, first dielectric layer 504 also includes oxygen (e.g., silicon oxynitride.) In the example embodiment illustrated in FIG. 5B, second dielectric layer 506 acts as a capping layer over first dielectric layer 504.

A top-down view is also illustrated taken across the dashed cross-section line A-A. The top-down view shows how both first dielectric layer 504 and second dielectric layer 506 may be deposited over all exposed sidewalls (e.g., all four sidewalls) of phase change layer 314.

First dielectric layer 504 may include silicon nitride due to its good adhesion properties to most other materials. First dielectric layer 504 may be deposited using PECVD or PEALD to a blanket thickness of between about 10 Å and about 50 Å, according to some such embodiments. Second dielectric layer 506 may include the same properties discussed above for dielectric layer 502 in FIG. 5A. Similarly, second dielectric layer 506 may be deposited using PECVD or PEALD to a blanket thickness between about 30 Å and 250 Å, according to some such embodiments. In still other example embodiments, second dielectric layer 506 is deposited very thin (e.g., less than about 10 Å) such that it acts like a glue layer to enhance the adhesion for additionally deposited dielectric materials. Note that in some cases, such as where first dielectric layer 504 is deposited with CVD, and second dielectric layer 506 is deposited with ALD, first dielectric layer 504 may be thicker at the top of the memory cell stack than it is at the bottom near the substrate (e.g., due to pinch-off), while second dielectric layer 506 may be relatively uniform along its entire length. In a more general sense, the degree to which a given layer's thickness varies or is otherwise non-uniform along that layer's length may depend on factors such as the specific deposition process employed and the aspect ratio of trenches between the stacks.

According to some embodiments, first dielectric layer 504 and second dielectric layer 506 are deposited in-situ. For example, substrate 301 may remain in the same chamber during the deposition of both first dielectric layer 504 and second dielectric layer 506 without breaking vacuum. The in-situ deposition of both dielectric films yields higher purity films and minimizes the risk of oxidation.

FIG. 5C illustrates another example embodiment where first dielectric layer 504 comprising silicon and nitrogen is deposited on one or more sidewalls of at least phase change layer 314, followed by second dielectric layer 506 comprising boron and nitrogen, and followed by a third dielectric layer 508 comprising silicon and nitrogen. In some such embodiments, third dielectric layer 508 also includes oxygen (e.g., silicon oxynitride.) Third dielectric layer 508 may include the same properties discussed above for first dielectric layer 504 in FIG. 5B, according to some such embodiments.

A top-down view is also illustrated taken across the dashed cross-section line A-A. The top-down view shows how each of first dielectric layer 504, second dielectric layer 506, and third dielectric layer 508 may be deposited over all exposed sidewalls (e.g., all four sidewalls) of phase change layer 314.

The multi-layer structure illustrated in FIG. 5C may be repeated any number of times to create any number of alternating silicon nitride/boron nitride films over the sidewalls of at least phase change layer 314. As also noted in FIG. 5B, each of first dielectric layer 504, second dielectric layer 506, and third dielectric layer 508 may be deposited in-situ. Any number of additional dielectric layers may be deposited in-situ to form an alternating layer stack over the sidewalls of at least phase change layer 314.

According to some embodiments, the total thermal conductivity of the dielectric layer stack on the sidewalls of phase change layer 314 may be modulated depending on the deposited thickness of the various layers. For example, the thermal environment around a given memory cell can be modulated by adjusting the proximity of second dielectric layer 506 to phase change layer 314. As will be appreciated, the proximity of second dielectric layer 506 to phase change layer 314 can be adjusted by adjusting the thickness of first dielectric layer 504.

Figure 6:
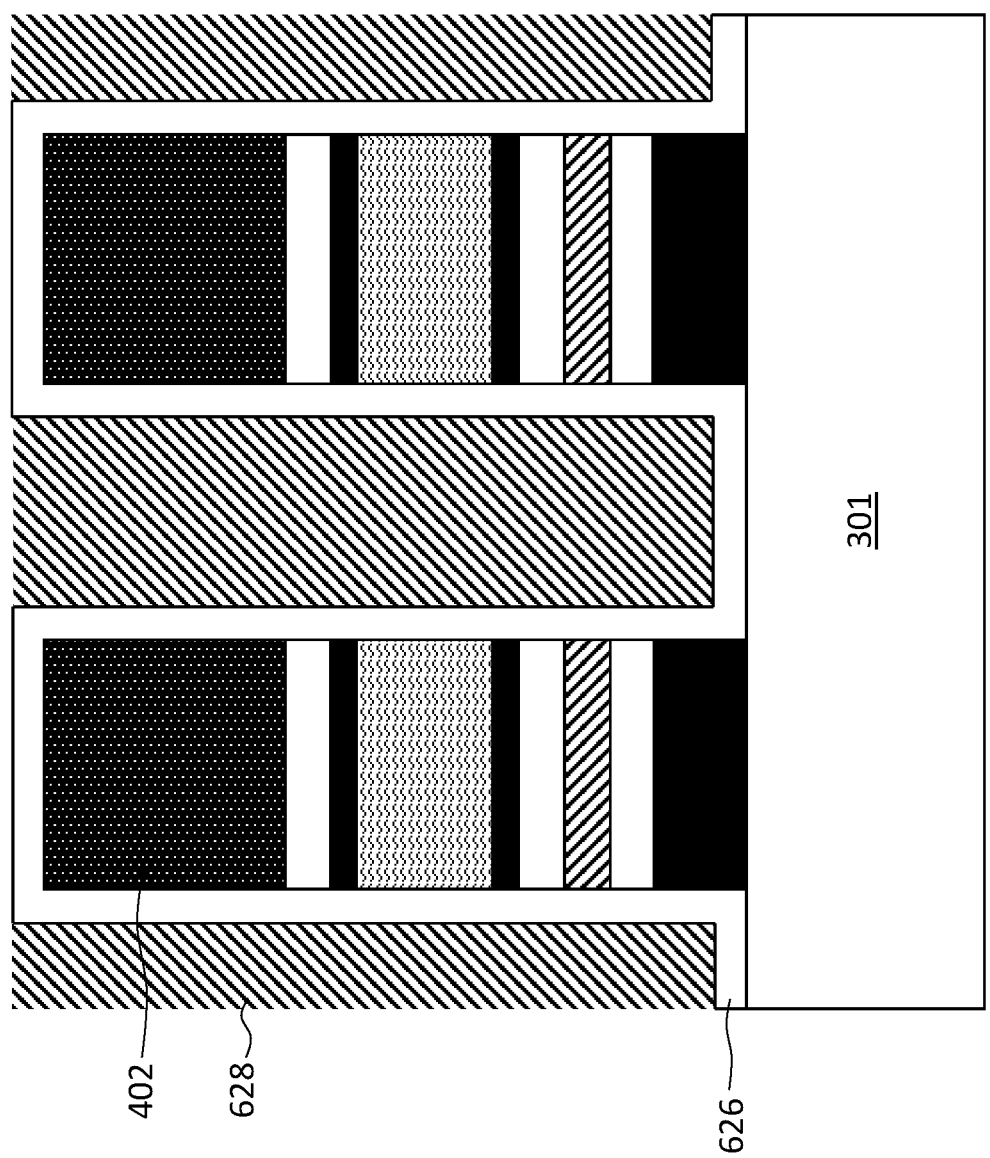
FIG. 6 illustrates a cross-section view of another stage in a fabrication process for a portion of a memory device, in accordance with some embodiments of the present disclosure.

FIG. 6 illustrates the deposition of a fill dielectric 628 between and around the various memory cells. Fill dielectric 628 is deposited over liner structure 626. Liner structure 626 represents any of the one or more dielectric layers included in the liner structure of example embodiments illustrated in FIGS. 5A-5C. For example, liner structure 626 may represent dielectric layer 502, the stack of first dielectric layer 504 and second dielectric layer 506, or the alternating layer structure that includes first dielectric layer 504, second dielectric layer 506, and third dielectric layer 508.

Fill dielectric 628 may be deposited to fill any remaining area between adjacent memory cells. In some embodiments, fill dielectric 628 is silicon oxide and is deposited using a PECVD process.

Figure 7:
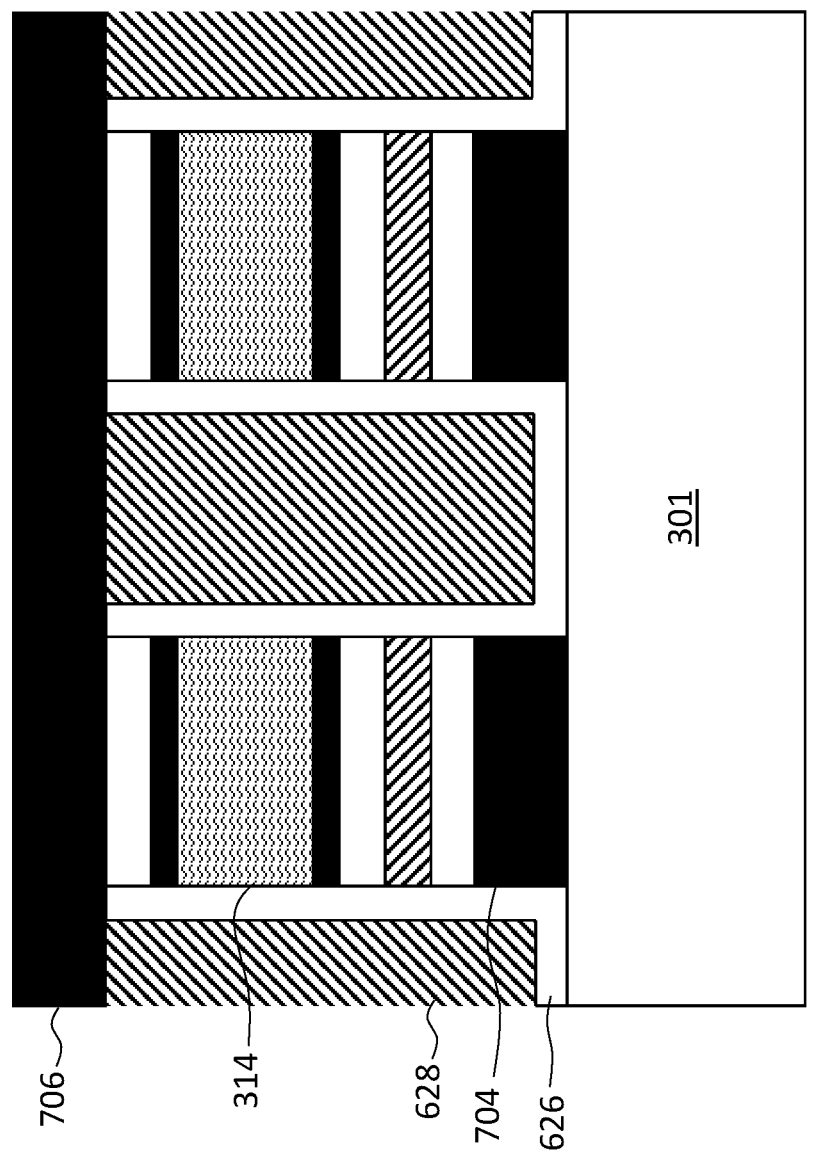
FIG. 7 illustrates a cross-section view of another stage in a fabrication process for a portion of a memory device, in accordance with some embodiments of the present disclosure.

FIG. 7 illustrates the completion of a first set of memory cells, according to some embodiments. After depositing fill dielectric 628, a top surface of the structure may be planarized using a chemical mechanical polishing (CMP) process. In some embodiments, this CMP process also removes mask layer 402. In some embodiments, the structure may be planarized down to any one of the conductive layers over phase change layer 314. Following the planarization, a conductive material layer 706 is deposited over the memory cells. Conductive material layer 706 may be patterned to form bit lines/word lines that run orthogonal to word lines/bit lines 704. In some embodiments, conductive material layer 706 is a metal, such as tungsten, silver, aluminum, titanium, cobalt, or an alloy.

Figure 8:
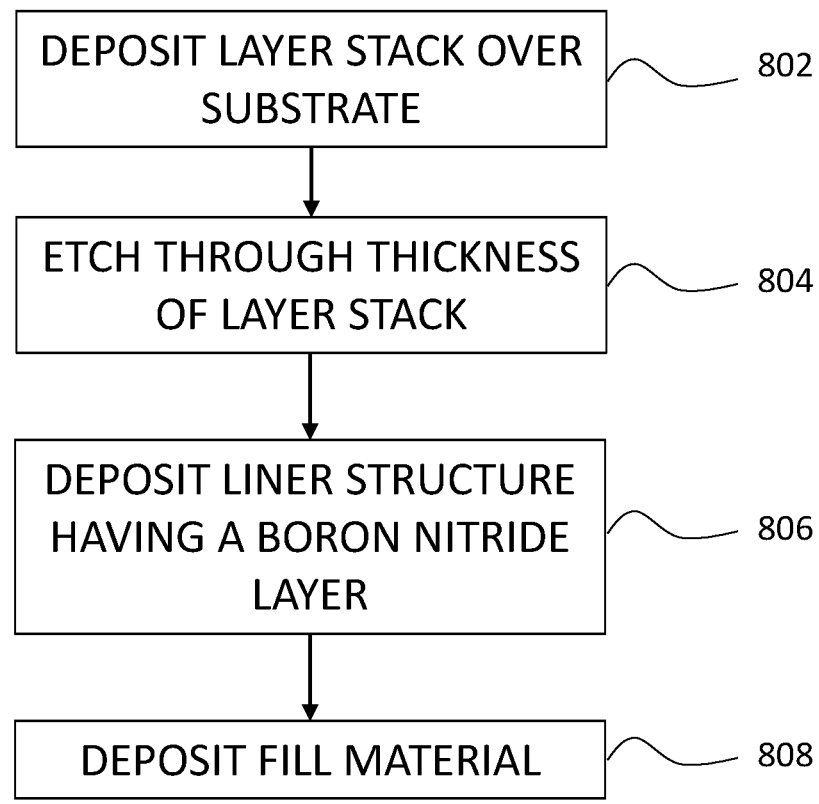
FIG. 8 is a flowchart of a fabrication process for a memory device, in accordance with an embodiment of the present disclosure.

FIG. 8 is a flow chart of a method 800 for fabricating a memory device that includes an array of memory cells having phase change material, according to an embodiment. Various operations of method 800 may be illustrated in FIGS. 3-7. However, the correlation of the various operations of method 800 to the specific components illustrated in FIGS. 3-7 is not intended to imply any structural and/or use limitations. Rather, FIGS. 3-7 provide one example embodiment of method 800. Other operations may be performed before, during, or after any of the operations of method 800.

Method 800 begins at operation 802 where a stack of layers is deposited over a substrate. The layer stack may include any number of conductive layers and at least one phase change layer. The layer stack may also include at least one selector layer. Each of the selector layer and the phase change layer may be sandwiched between one or more of the conductive layers in the layer stack. The phase change layer may include chalcogenide while the selector layer may include chalcogenide doped with arsenic, in one example. Previous relevant discussion with respect to memory cell configuration and example materials for phase change and selector layer is equally applicable here.

Method 800 continues with operation 804 where a thickness of the layer stack is etched through using one or more dry and/or wet etching processes. In one example embodiment, a dry anisotropic etch process is used, to provide a highly directional etch. A sufficient thickness of the layer stack may be etched through such that sidewalls of the at least one phase change layer are exposed. In some embodiments, the etching process is performed in stages with multiple etches being performed and broken up by depositing additional thin dielectric layers over the etched structures. For example, an initial etch may go to a depth that fully exposes sidewalls of the phase change material, but then stops shortly thereafter. At this point, operation 806 can be carried out, in some such embodiments. Then the etch can be continued to further liberate the individual memory stacks of the array.

Method 800 continues with operation 806 where a liner structure is deposited that includes at least one boron nitride layer. The liner structure is deposited over the sidewalls of at least the phase change layer. In some embodiments, the first layer of the liner structure is deposited on the sidewalls of at least the phase change layer. In some such embodiments, the liner structure may include only a single boron nitride dielectric layer, as described for example in FIG. 5A. In other such embodiments, the liner structure may include a silicon nitride layer with a boron nitride layer deposited on it, as described for example in FIG. 5B. In still other embodiments, the liner structure includes an alternating stack of silicon nitride and boron nitride having any number of total layers. In any such cases, and as will be appreciated in light of this disclosure, the inclusion of at least one boron nitride layer in the liner structure provides improved protection of the phase change layer from contaminants and oxidation. Furthermore, the boron nitride layer exhibits a high thermal conductivity which aids in the dissipation of heat during operation of the memory cells.

If a partial etch was executed at operation 804, then the final partial or remaining etch to complete operation 804 can be carried out after the liner structure is provisioned at operation 806. As will be further appreciated, if the liner structure is provisioned after such a partial etch of the memory stacks, the liner structure further protects the phase change layer from any effluent and debris that may result from the remainder of the etch, including metal contaminants from lower level contacts.

Method 800 continues with operation 808 where a fill material is deposited over the liner structure. The fill material may include silicon oxide and be deposited to fill any remaining space between adjacent memory cells following the deposition of the liner structure. Previous relevant discussion with respect to example fill materials and subsequent processing (e.g., planarization) is equally applicable here.

Example Electronic Device

Figure 9:
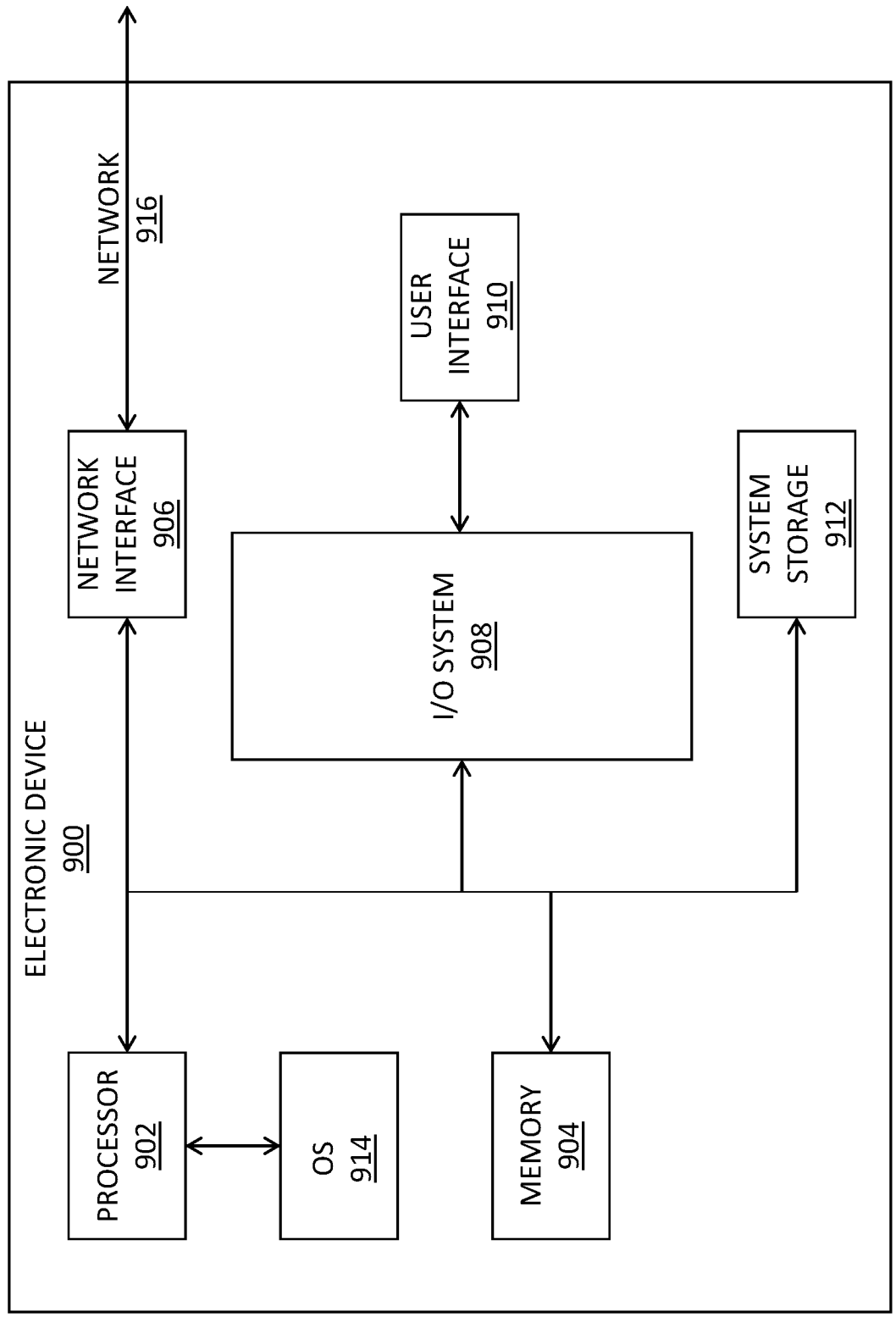
FIG. 9 illustrates an example electronic device that can include one or more of the embodiments of the present disclosure.

FIG. 9 illustrates an example electronic device 900 that may include one or more memory devices such as the embodiments disclosed herein. In some embodiments, electronic device 900 may host, or otherwise be incorporated into a personal computer, workstation, server system, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, imaging device, wearable device, embedded system, and so forth. Any combination of different devices may be used in certain embodiments.

In some embodiments, electronic device 900 may comprise any combination of a processor 902, a memory 904, a network interface 906, an input/output (I/O) system 908, a user interface 910, and a storage system 912. As can be further seen, a bus and/or interconnect is also provided to allow for communication between the various components listed above and/or other components not shown. Electronic device 900 can be coupled to a network 916 through network interface 906 to allow for communications with other computing devices, platforms, or resources. Other componentry and functionality not reflected in the block diagram of FIG. 9 will be apparent in light of this disclosure, and it will be appreciated that other embodiments are not limited to any particular hardware configuration.

Processor 902 can be any suitable processor and may include one or more coprocessors or controllers to assist in control and processing operations associated with electronic device 900. In some embodiments, processor 902 may be implemented as any number of processor cores. The processor (or processor cores) may be any type of processor, such as, for example, a micro-processor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core.

Memory 904 can be implemented using any suitable type of digital storage including, for example, flash memory and/or random access memory (RAM). In some embodiments, memory 904 may include various layers of memory hierarchy and/or memory caches as are known to those of skill in the art. Memory 904 may be implemented as a volatile memory device such as, but not limited to, a RAM, dynamic RAM (DRAM), or static RAM (SRAM) device. Storage system 912 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage system 912 may comprise technology to increase the storage performance enhanced protection for valuable digital media when multiple hard drives are included. According to some embodiments of the present disclosure, either or both memory 904 and storage system 912 includes one or more memory arrays 100 having memory cells 102 fabricated using the processes discussed herein. According to some embodiments of the present disclosure, either or both memory 904 and storage system 912 may be incorporated in a chip package 200 and bonded to a printed circuit board (PCB) along with one or more other devices.

Processor 902 may be configured to execute an Operating System (OS) 914 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS).

Network interface 906 can be any appropriate network chip or chipset which allows for wired and/or wireless connection between other components of electronic device 900 and/or network 916, thereby enabling electronic device 900 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 908 may be configured to interface between various I/O devices and other components of electronic device 900. I/O devices may include, but not be limited to, a user interface 910. User interface 910 may include devices (not shown) such as a display element, touchpad, keyboard, mouse, and speaker, etc. I/O system 908 may include a graphics subsystem configured to perform processing of images for rendering on a display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 902 or any chipset of electronic device 900.

It will be appreciated that in some embodiments, the various components of the electronic device 900 may be combined or integrated in a system-on-a-chip (SoC) architecture. In some embodiments, the components may be hardware components, firmware components, software components or any suitable combination of hardware, firmware or software.

In various embodiments, electronic device 900 may be implemented as a wireless system, a wired system, or a combination of both. When implemented as a wireless system, electronic device 900 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, electronic device 900 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

Numerous specific details have been set forth herein to provide a thorough understanding of the embodiments. It will be understood in light of this disclosure, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is a memory device that includes an array of memory cells. Each of the memory cells includes a stack of layers comprising at least one phase change layer and a dielectric layer over one or more sidewalls of at least the phase change layer. The dielectric layer comprises nitrogen and boron. In some such example cases, the dielectric layer is boron nitride.

Example 2 includes the subject matter of Example 1, wherein the dielectric layer is a first dielectric layer, and the device further comprises a second dielectric layer on at least the one or more sidewalls of at least the phase change layer, wherein the first dielectric layer is on the second dielectric layer.

Example 3 includes the subject matter of Example 2, wherein the second dielectric layer comprises silicon and nitrogen. In some such example cases, the second dielectric layer is silicon nitride.

Example 4 includes the subject matter of Example 2 or 3, further comprising a third dielectric layer on the first dielectric layer.

Example 5 includes the subject matter of Example 4, wherein the third dielectric layer comprises silicon and nitrogen. In some such example cases, the second dielectric layer is silicon nitride.

Example 6 includes the subject matter of any one of Examples 1-5, wherein the stack of layers further comprises at least one selector layer.

Example 7 includes the subject matter of Example 6, wherein the at least one selector layer comprises chalcogenide.

Example 8 includes the subject matter of any one of Examples 1-7, wherein the at least one phase change layer comprises chalcogenide.

Example 9 is an integrated circuit that includes the memory device of any one of claims 1-8.

Example 10 is a printed circuit board that includes the integrated circuit of claim 9.

Example 11 is a memory chip that includes the memory device of any one of claims 1-8.

Example 12 is an electronic device that includes a chip package having one or more dies. At least one of the one or more dies includes a stack of layers comprising at least one phase change layer and a dielectric layer over one or more sidewalls of at least the phase change layer. The dielectric layer comprises nitrogen and boron. In some such example cases, the dielectric layer is boron nitride.

Example 13 includes the subject matter of Example 12, wherein the dielectric layer is a first dielectric layer, the device further comprises a second dielectric layer on at least the one or more sidewalls of at least the phase change layer, wherein the first dielectric layer is on the second dielectric layer.

Example 14 includes the subject matter of Example 13, wherein the second dielectric layer comprises silicon and nitrogen. In some such example cases, the second dielectric layer is silicon nitride.

Example 15, includes the subject matter of Example 13 or 14, further comprising a third dielectric layer on the first dielectric layer.

Example 16 includes the subject matter of Example 15, wherein the third dielectric layer comprises silicon and nitrogen. In some such example cases, the third dielectric layer is silicon nitride.

Example 17 includes the subject matter of any one of Examples 12-16, wherein the stack of layers further comprises at least one selector layer.

Example 18 includes the subject matter of Example 17, wherein the at least one selector layer comprises chalcogenide.

Example 19 includes the subject matter of any one of Examples 12-18, wherein the at least one phase change layer comprises chalcogenide.

Example 20 is a method of fabricating a memory device. The method includes depositing a stack of layers over a substrate, the stack of layers comprising at least one phase change layer; etching through a thickness of the stack of layers such that one or more sidewalls of the at least one phase change layer are exposed; and depositing a dielectric layer over at least the one or more sidewalls of at least the phase change layer, the dielectric layer comprising nitrogen and boron. In some such example cases, the dielectric layer is boron nitride.

Example 21 includes the subject matter of Example 20, wherein the dielectric layer is a first dielectric layer, the method further comprising depositing a second dielectric layer on at least the one or more sidewalls of at least the phase change layer, wherein depositing the first dielectric layer comprises depositing the first dielectric layer on the second dielectric layer.

Example 22 includes the subject matter of Example 21, wherein depositing the first dielectric layer and depositing the second dielectric layer are performed in-situ.

Example 23 includes the subject matter of Example 21 or 22, wherein the second dielectric layer comprises silicon and nitrogen. In some such example cases, the second dielectric layer is silicon nitride.

Example 24 includes the subject matter of any one of Examples 21-23, further comprising depositing a third dielectric layer on the first dielectric layer.

Example 25 includes the subject matter of Example 24, wherein the third dielectric layer comprises silicon and nitrogen. In some such example cases, the third dielectric layer is silicon nitride.

Example 26 includes the subject matter of any one of Examples 20-25, wherein the stack of layers further comprises at least one selector layer.

Example 27 includes the subject matter of any one of Examples 20-26, wherein depositing the dielectric layer comprises depositing the dielectric layer using plasma-enhanced chemical vapor deposition (PECVD).

Example 28 includes the subject matter of Example 27, wherein depositing the dielectric layer comprises depositing the dielectric layer at a temperature between about 150° C. and about 280° C.

Example 29 includes the subject matter of Example 27 or 28, wherein depositing the dielectric layer comprises depositing using a boron precursor selected from one or more of hydrides of boron, halides of boron, alcohols of boron, esters of boron, and a diborane-ammonia (BH$_3$.NH$_3$) coordination complex.

Example 30 includes the subject matter of any one of Examples 27-29, wherein depositing the dielectric layer comprises depositing using a nitrogen precursor selected from one or more of nitrogen gas, ammonia, and hydrazine.

Example 31 includes the subject matter of any one of Examples 20-30, wherein depositing the dielectric layer comprises depositing the dielectric layer to a blanket thickness between about 5 Å and about 300 Å.

Example 32 includes the subject matter of any one of Examples 20-31, wherein the at least one phase change layer comprises chalcogenide.

What is claimed is:

1. A memory device, comprising:
   an array of memory cells, each memory cell comprising
   a stack of layers comprising at least one phase change layer;
   a first dielectric layer over one or more sidewalls of at least the phase change layer, the first dielectric layer comprising nitrogen and boron; and
   a second dielectric layer on at least the one or more sidewalls of at least the phase change layer, wherein the first dielectric layer is on the second dielectric layer.

2. The memory device of claim 1, wherein the second dielectric layer comprises silicon and nitrogen.

3. The memory device of claim 1, further comprising a third dielectric layer on the first dielectric layer.

4. The memory device of claim 3, wherein the third dielectric layer comprises silicon and nitrogen.

5. The memory device of claim 1, wherein the stack of layers further comprises at least one selector layer.

6. An integrated circuit comprising the memory device of claim 1.

7. An electronic device, comprising:
   a chip package comprising one or more dies, at least one of the one or more dies comprising
   a stack of layers comprising at least one phase change layer;
   a first dielectric layer over one or more sidewalls of at least the phase change layer, the first dielectric layer comprising nitrogen and boron; and
   a second dielectric layer on at least the one or more sidewalls of at least the phase change layer, wherein the first dielectric layer is on the second dielectric layer.

8. The electronic device of claim 7, wherein the second dielectric layer comprises silicon and nitrogen.

9. The electronic device of claim 7, further comprising a third dielectric layer on the first dielectric layer.

10. The electronic device of claim 9, wherein the third dielectric layer comprises silicon and nitrogen.

11. The electronic device of claim 7, wherein the stack of layers further comprises at least one selector layer.

12. A method of fabricating a memory device, comprising:
    depositing a stack of layers over a substrate, the stack of layers comprising at least one phase change layer;
    etching through a thickness of the stack of layers such that one or more sidewalls of the at least one phase change layer are exposed; and
    depositing a first dielectric layer over one or more sidewalls of at least the phase change layer, the first dielectric layer comprising nitrogen and boron; and
    depositing a second dielectric layer on at least the one or more sidewalls of at least the phase change layer, wherein the first dielectric layer is on the second dielectric layer.

13. The method of claim 12, wherein the second dielectric layer comprises silicon and nitrogen.

14. The method of claim 12, further comprising depositing a third dielectric layer on the first dielectric layer.

15. The method of claim 14, wherein the third dielectric layer comprises silicon and nitrogen.

16. The method of claim 12, wherein the stack of layers further comprises at least one selector layer.

17. The method of claim 12, wherein the at least one phase change layer comprises chalcogenide.

* * * * *